United States Patent
Morie et al.

(10) Patent No.: US 6,472,932 B2
(45) Date of Patent: Oct. 29, 2002

(54) TRANSCONDUCTOR AND FILTER CIRCUIT

(75) Inventors: Takashi Morie, Osaka (JP); Shiro Dosho, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/774,342

(22) Filed: Jan. 31, 2001

(65) Prior Publication Data

US 2001/0020865 A1 Sep. 13, 2001

(30) Foreign Application Priority Data

Jan. 31, 2000 (JP) .................................... 2000-023413

(51) Int. Cl.⁷ .................................................. G06G 7/12
(52) U.S. Cl. ........................ 327/563; 327/563; 330/256
(58) Field of Search ................................ 327/560, 561, 327/562, 563; 330/253, 254, 256

(56) References Cited

U.S. PATENT DOCUMENTS

| 3,792,367 A | * | 2/1974 | Fleischer et al. ............. 330/98 |
| 5,394,112 A | * | 2/1995 | Alini et al. .................. 330/256 |
| 5,463,349 A | * | 10/1995 | Petersen et al. ............. 330/254 |
| 5,625,317 A | * | 4/1997 | Deveirman .................. 327/353 |
| 5,926,068 A | * | 7/1999 | Harr ............................ 330/254 |
| 5,999,052 A | * | 12/1999 | Tang ........................... 330/254 |

OTHER PUBLICATIONS

Pavan et al., "High Frequency Continuous Time Filters in Digital CMOS Processes", Kluwer Academic Publishers, pp. 66–67, Mar. 2000.

* cited by examiner

*Primary Examiner*—Timothy P. Callahan
*Assistant Examiner*—An T. Luu
(74) *Attorney, Agent, or Firm*—RatnerPrestia

(57) ABSTRACT

A transconductor which has a transconductance gm and which receives an input voltage $V_{In}$ and outputs in response to the input voltage $V_{in}$ an output current $I_{out}$ of $gm \times V_{in}$, wherein: the transconductor includes a plurality of sub-transconductors which are connected in parallel to one another; and at least one control signal is input to the plurality of sub-transconductors, and the plurality of sub-transconductors are controlled by the at least one control signal such that at least one of the plurality of sub-transconductors has a negative transconductance, whereby the transconductance gm of the transconductor can be varied.

13 Claims, 10 Drawing Sheets gm addition/subtraction control $gm = (gm1 + gm1 + \cdots - gm2 - gm2 - gm2)$
Cutoff Frequency $= (gm1 + gm1 + \cdots - gm2 - gm2 - gm2 \cdots )/C$ Cutoff frequency $Fc = \dfrac{gm}{C}$

TRANSCONDUCTOR AND FILTER CIRCUIT

BACKGROUND OF THE INVENTION

1. Field of the Invention

The present invention relates to a filter circuit having a transconductor and a capacitor, and more specifically to a transconductor for use in such a filter circuit.

2. Description of the Related Art

A transconductor can provide an output current which is proportional to an input voltage wherein the transconductance is a proportional constant. Therefore, the transconductor is used in a filter circuit, an amplifier, a current transformer, a calibrator, etc.

In a disk system such as a DVD system, in order to ensure compatibility with various media and multiple speed reproduction, a filter circuit used for a signal processing with a disk needs to process signals in a wide speed range from a high speed signal to a low speed signal. The high speed signal is about 100 times higher than the low speed signal. Therefore, the maximum value of a cutoff frequency $F_C$ should be about 100 times or more greater than the minimum value of the cutoff frequency $F_C$. FIG. 11 shows an example of a transconductor used in such a high speed filter circuit. The high-speed filter circuit of FIG. 11 is an example of a conventional GM-C filter circuit including a transconductor (GM circuit) and capacitors (C). Specifically, in the GM-C filter circuit shown in FIG. 11, a plurality of capacitors 902 which are in parallel to one another are connected through a plurality of switches 903 to a transconductor (GM circuit) 901. The cutoff frequency ($F_C$), which is a filter characteristic of the GM-C filter circuit, is represented by expression (1) of gm (transconductance of the transconductor) and C (capacitance):

$$F_C = gm/C \quad (1)$$

Thus, in order to improve the filter characteristic, it is necessary to extend the variation range of the cutoff frequency $F_C$. For that purpose, as seen from expression (1), it is necessary to extend the variation range of transconductance gm or the variation range of capacitance C.

According to the conventional technology, it is very difficult to extend the variation range of the transconductance gm of the transconductor 901. In particular, it is more difficult to extend the variation range of transconductance in a transconductor formed by a CMOS transistor than in a transconductor formed by a bipolar transistor, the transconductor formed by a CMOS transistor typically has a transconductance which varies over a variation range wherein the maximum limit is only about 10 times greater at most than the minimum limit. Therefore, in the case of making a filter circuit shown in FIG. 11 using a CMOS transistor with such a narrow variation range of conductance, capacitors 902 to be connected to the transconductor 901 are selected by the switches 903 to change the entire capacitance C, whereby the cutoff frequency is changed. That is, by making the capacitance C variable as well as the transconductance gm of the transconductor 901. The variation range of the cutoff frequency is extended.

Now, consider a case where the cutoff frequency needs to have a variation range wherein the maximum limit is about 100 times greater than the minimum limit, while the transconductance gm of the transconductor 901 has a variation range wherein the maximum limit is only about 10 times greater than the minimum limit. In this case, the whole capacitance C of the capacitors 902 needs to have a variation range in which the maximum limit is about 10 times greater than the minimum limit by the selection of the switches 903. The minimum value of the whole capacitance C of the capacitors 902 is limited due to noise, stability of circuit performance, difference in capacitance among the respective capacitors, etc. Accordingly, the capacitance C of the capacitors 902 cannot be significantly reduced. Thus, in the case where a filter circuit includes a plurality of capacitors 902 so that the total capacitance in the filter circuit is changed by various combinations of the capacitors 902 over a variation range wherein the maximum limit is about 10 times greater than the minimum limit, the circuit area increases. Furthermore, the on-resistance of the switch 903 which is directly connected to the capacitor 902 deteriorates the group delay of the filter circuit.

Thus, it is preferable to provide a transconductor which has a variation range of transconductance wherein the maximum limit is about 100 times or more greater than the minimum limit. With a transconductor having such a wide variation range of transconductance, a faster filter circuit, a faster current transformer, etc., can be achieved.

SUMMARY OF THE INVENTION

According to one aspect of the present invention, a transconductor has a transconductance gm and receives an input voltage $V_{In}$ and outputs in response to the input voltage $V_{in}$ an output current $I_{nst}$ of $gm \times V_{in}$, wherein: the transconductor includes a plurality of sub-transconductors which are connected in parallel to one another: and at least one control signal is input to the plurality of sub-transconductors, and the plurality of sub-transconductors are controlled by the at least one control signal such that at least one of the plurality of sub-transconductors has a negative transconductance, whereby the transconductance gm of the transconductor can be varied.

In one embodiment of the present invention, the at least one of sub-transconductors includes a differential input/output transconductor and a plurality of switching sections, the plurality of switching sections are connected to a first input terminal and a second input terminal of the differential input/output transconductor, and the plurality of switching sections are switched in response to the at least one control signal, thereby switching a sign of a transconductance of the differential input/output transconductor.

In another embodiment of the present invention, the plurality of sub-transconductors include one or more first sub-transconductors having a first polarity transconductance and one or more second sub-transconductors having a second polarity transconductance; and an operation (on/off) state of each of the one or more first and second sub-transconductors is selectively switched by the at least one control signal.

In still another embodiment of the present invention, each of the one or more first and second sub-transconductors is a differential input/output transconductor.

In still another embodiment of the present invention, the differential input/output transconductor has an input terminal with a first polarity, an input terminal with a second polarity, an output terminal with a first polarity, and an output terminal with a second polarity; a difference between a first input voltage which is input to the input terminal with a first polarity and a second input voltage which is input to the input terminal with a second polarity is equal to the input voltage; and a difference between a first output current which is output from the output terminal with a first polarity and a second output current which is output from the output terminal with a second polarity is equal to the output current.

In still another embodiment of the present invention, the transconductor further includes: a first transistor with a first polarity which has a source connected to a power supply with a first polarity, a gate connected to a bias terminal, and a drain connected to the output terminal with a first polarity; a second transistor with a first polarity which has a source connected to the power supply with a first polarity, a gate connected to the bias terminal, and a drain connected to the output terminal with a second polarity; first and second sub-transconductor components each having at least one unit transconductor, the first and second sub-transconductor components being connected to the output terminal with a first polarity; and third and fourth sub-transconductor components each having at least one unit transconductor, the third and fourth sub-transconductor components being connected to the output terminal with a second polarity, wherein the first and third sub-transconductor components are connected to the first input terminal to which the first input voltage is input, and the second and fourth sub-transconductor components are connected to the second input terminal to which the second input voltage is input, whereby a sub-transconductor formed by the first and fourth sub-transconductor components has a transconductance with a first polarity, and a sub-transconductor formed by the second and third sub-transconductor components has a transconductance with a second polarity, and by the at least one control signal which is input to the first and fourth sub-transconductor components and to the second and third sub-transconductor components, the transconductance with a first polarity of sub-transconductor formed by the first and fourth sub-transconductor components and the transconductance with a second polarity of sub-transconductor formed by the second and third sub-transconductor components are controlled.

In still another embodiment of the present invention, the control signal which is input to the first and fourth sub-transconductor components and the control signal which is input to the second and third sub-transconductor components are different.

In still another embodiment of the present invention, the unit transconductor includes: a third transistor with a second polarity which has a gate to which one of the first and second input voltages is input and a source connected to a power supply with a second polarity, and a fourth transistor with a second polarity which has a gate to which the control signal is input, a source connected to a drain of the third transistor, and a drain connected to one of the output terminal with a first polarity and the output terminal with a second polarity.

In still another embodiment of the present invention, each of the first to fourth sub-transconductor components includes a pair of unit transconductors.

In still another embodiment of the present invention, the sub-transconductor component includes: a third transistor with a second polarity which has a gate to which one of the first and second input voltages is input and a source connected to a power supply with a second polarity; a fourth transistor with a second polarity which has a gate to which the control signal is input, a source connected to a drain of the third transistor, and a drain connected to one of the output terminal with a first polarity and the output terminal with a second polarity; a fifth transistor with a second polarity which has a gate to which one of the first and second input voltages is input and a source connected to a power supply with a second polarity; and a sixth transistor with a second polarity which has a gate to which the control signal is input, a source connected to a drain of the fifth transistor, and a drain connected to the output terminal to which a drain of the fourth transistor is connected.

In still another embodiment of the present invention, the control signal which is input to the fourth transistor and the control signal which is input to the sixth transistor are different.

According to another aspect of the present invention, a filter circuit includes: the transconductor of claim 1; and a capacitor connected to the transconductor.

In one embodiment of the present invention, a plurality of the filter circuits are connected into a ladder arrangement or a cascade arrangement.

According to still another aspect of the present invention, a filter circuit includes: a plurality of transconductors, each of the plurality of transconductors outputting an output current which is proportional to an input voltage, each of the plurality of transconductors having an input terminal to which the input voltage is input and an output terminal from which the output current is output; a plurality of capacitors; a plurality of first switching sections; and a plurality of second switching sections, wherein each of the plurality of capacitors is connected to an output terminal of at least one of the plurality of transconductors, each of the plurality of first switching sections is connected to an input terminal of one of the plurality of transconductors, each of the plurality of second switching sections is connected to an output terminal of one of the plurality of transconductors, and a transconductor to be selected among the plurality of transconductors can be controlled by a plurality of first control signals which are input to each of the plurality of transconductors and a second control signal which is input to each of the plurality of first and second switching sections.

In one embodiment of the present invention, the plurality of transconductors and the plurality of capacitors are connected into a ladder arrangement or a cascade arrangement.

In another embodiment of the present invention, the filter circuit further includes a measurement section for measuring a transconductance of the transconductor, wherein the transconductor to be selected among the plurality of transconductors is turned on by the first control signal, and in response to the turning on, the first switching section connected to an input terminal of the selected transconductor and the second switching section connected to an output terminal of the selected transconductor are turned on by the second control signal, whereby the measurement section measures a transconductance of the transconductor.

In still another embodiment of the present invention, the first control signal finely adjusts the measured transconductance of the transconductor based on the measured transconductance of the transconductor.

In still another embodiment of the present invention, each of the plurality of transconductors includes a plurality of sub-transconductors which are connected in parallel to one another; and a control signal is input to the plurality of sub-transconductors, and the plurality of sub-transconductors are controlled by the control signal such that at least one of the plurality of sub-transconductors has a negative transconductance, whereby the transconductance of the transconductor can be varied.

Thus, the invention described herein makes possible the advantages of (1) providing a transconductor having a wide variation range of transconductance; and (2) providing a filter circuit in which a transconductor having a wide variation range of transconductance is used, whereby filter characteristics such as cutoff frequency, the Q-factor (quality factor), etc., can be varied without employing a large capacitor which would increase the device area.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described.

Embodiment 1

Figure 1A:
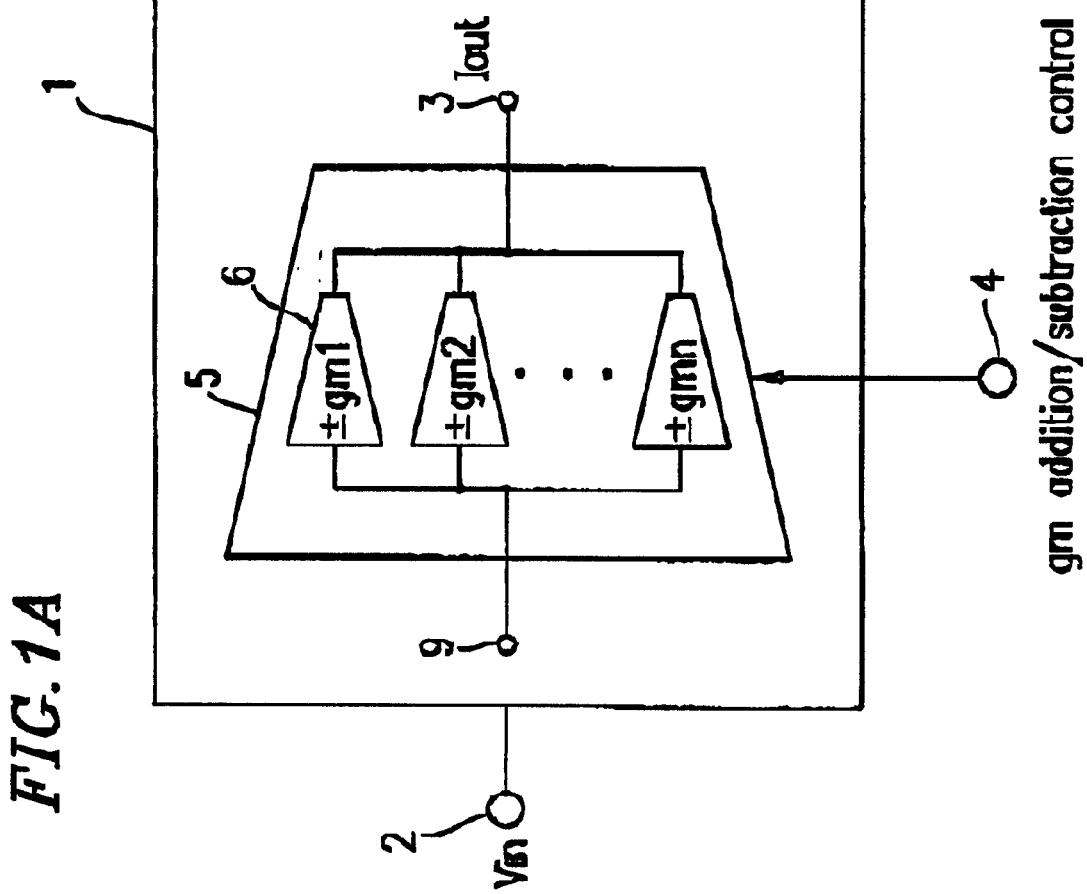
FIG. 1A shows an example of a GM-C filter circuit including a transconductor according to the present invention and a capacitor connected thereto.

FIG. 1A shows a structure of a filter circuit 1 including a transconductor according to the present invention. The filter circuit 1 is a GM-C filter circuit including a transconductor 5 and a capacitor 7 connected thereto. In the GM-C filter circuit 1, various transfer functions are achieved by a basic circuit including the transconductor 5 and the capacitor 7 in which an input terminal 3 of the transconductor 5 is connected to an input terminal 8 of the capacitor 7. The transconductor 5 is formed by a plurality of sub-transconductors (n sub-transconductors) 6 connected in parallel to each other. The sub-transconductors 6 respectively have transconductances gm1, gm2, . . . , gmn. At least one of the plurality of sub-transconductors 6 may have a negative transconductance.

Figure 1B:
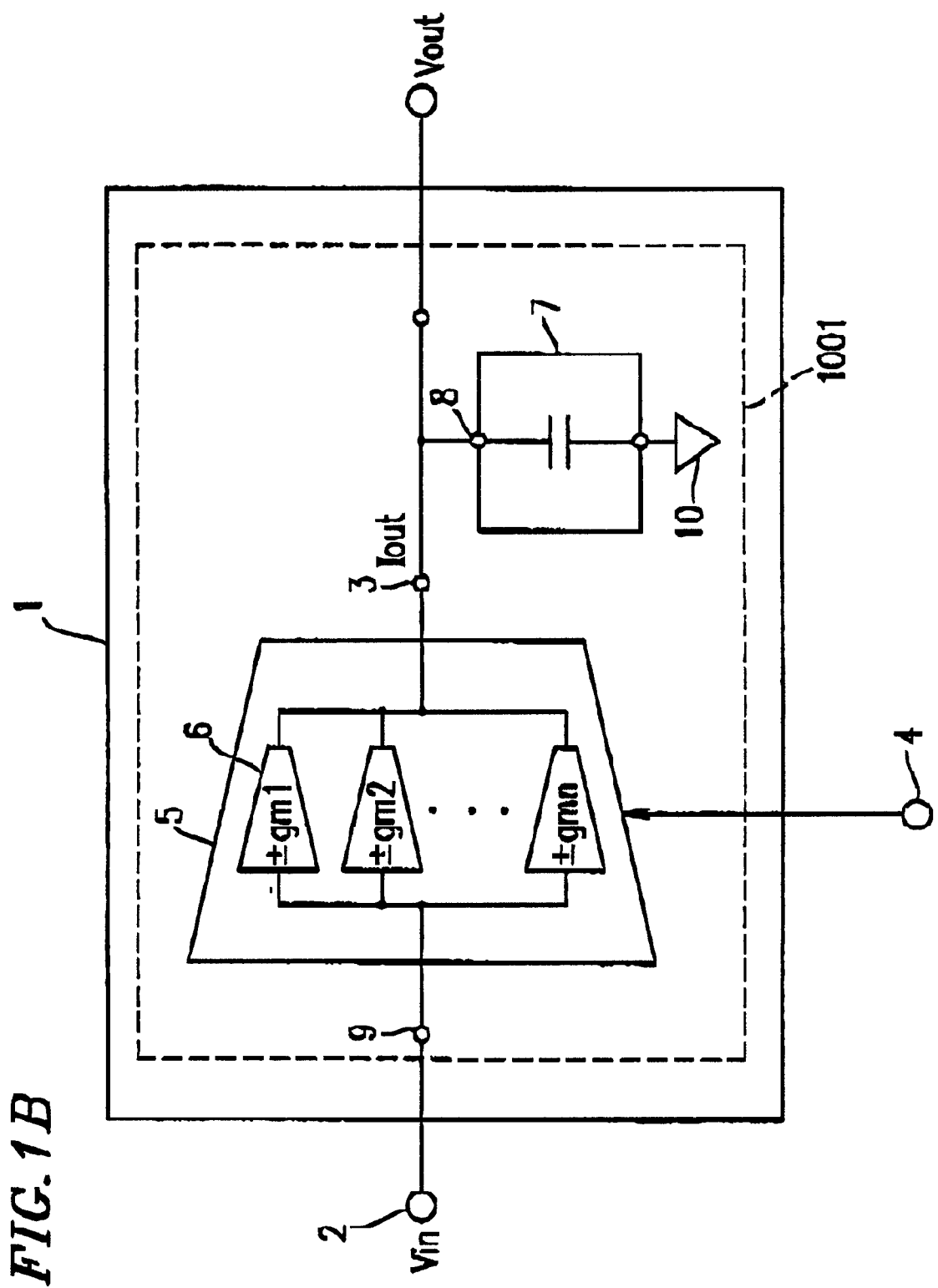
FIG. 1B shows an example of a connection between the transconductor according to the present invention and the capacitor shown in FIG. 1A.

The connection between the transconductor 5 and the capacitor 7 is not shown in FIG. 1A. The transconductor 5 and the capacitor 7 can be connected in any manner as long as the output terminal 3 of the transconductor 5 is connected to the input terminal 8 of the capacitor 7. For example, the transconductor 5 and the capacitor 7 are connected as shown in FIG. 1B. Alternatively, the filter circuit 1 may include a plurality of basic circuits 1001 formed by one transconductor 5 and one capacitor 7. In this case, the basic circuits 1001 in the filter circuit 1 may be connected in any arrangement such as a ladder arrangement, a cascade arrangement, etc. In FIG. 1B, a reference numeral 9 denotes an input terminal of the transconductor 5, and a reference numeral 10 denotes a ground or a potentiostatic terminal. The input terminal 9 of the transconductor 5 is connected to an input terminal 2 of the filter circuit 1.

In response to a control signal from a control terminal 4, one or more sub-transconductors 6 are selected. The transconductance of the transconductor 5 is determined by the transconductance of the selected sub-transconductors 6. The transconductor 5 outputs from an output terminal 3 a current $I_{out}$ which is proportional to an input voltage $V_{in}$ received at an input terminal 2 wherein the transconductance of the transconductor 5 is a proportional constant. The GM-C filter circuit including the transconductor 5 formed by the plurality of sub-transconductors 6 and the capacitor 7 is used as a basic circuit, and a plurality of such GM-C filter circuits may be connected together into a ladder arrangement, a cascade arrangement, etc., according to a purpose thereof. For simplicity of illustration, only one control signal is shown, but a plurality of control signals may be provided.

Now, an operation of a filter circuit 1 having the above structure is described. The filter circuit 1 outputs an output current $I_{out}$ which is proportional to an input voltage $V_{in}$. Typically, the filter circuit 1 outputs an output current represented by expression (2):

$$I_{out} = gm \times V_{in} \quad (2)$$

where gm denotes the transconductance of the entire transconductor 5.

As shown in FIG. 1A, in the case of the transconductor 5 having n sub-transconductors 6, the relationship between the input voltage $V_{in}$ and the output current $I_{out}$ is represented by expression (3):

$$I_{out} = (\pm gm1 \pm gm2 \pm gm3 \ldots \pm gmn) \times V_{in} \quad (3)$$

where gm1–gmn denote the transconductances of the respective sub-transconductors 6. Each of the transconductances gm1–gmn of the sub-transconductors 6 varies according to its circuit structure, but a wide variation range of the transconductance cannot be obtained. For example, it is difficult to provide a wide variation range for the conductance of each sub-transconductor wherein the maximum limit of the variation range is about 10 times or more greater than the minimum limit thereof.

However, in the case where the transconductor 5 is constructed of a plurality of sub-transconductors 6 connected in parallel to one another, by selectively adding or subtracting the transconductances of the sub-transconductors 6, the transconductance gm of the transconductor 5 can be varied widely. When a high cutoff frequency $F_C$ is required, the transconductances of all the sub-transconductors 6 are added. Inversely, when a low cutoff frequency $F_C$ is produced, the transconductance of any of the sub-transconductors 6 are subtracted. Theoretically, the transconductance gm of the transconductor 5 can be reduced to zero. Thus, the minimum value of the transconductance gm of the transconductor 5 is zero, and the maximum value thereof is (gm1+gm2+. . . gmn). That is, a transconductor having the above structure can provide a wide variation range for transconductance which is much greater than a conventional variation range wherein the maximum limit is about 10 times greater than the minimum limit.

As described above, a transconductor according to the present invention has a plurality of sub-transconductors connected in parallel to one another. The transconductor is controlled by a control signal such that at least one of the plurality of sub-transconductors has a negative transconductance. With such a structure, the transconductance of the transconductor can be widely varied.

Furthermore, the variation of transconductance gm of the transconductor 5 influences other important parameters of the filter circuit such as the Q-factor, etc., in addition to the cutoff frequency $F_C$. Thus, with a wide variation range of transconductance gm of the transconductor 5, it is possible to widely change various filter characteristics.

Figure 2:
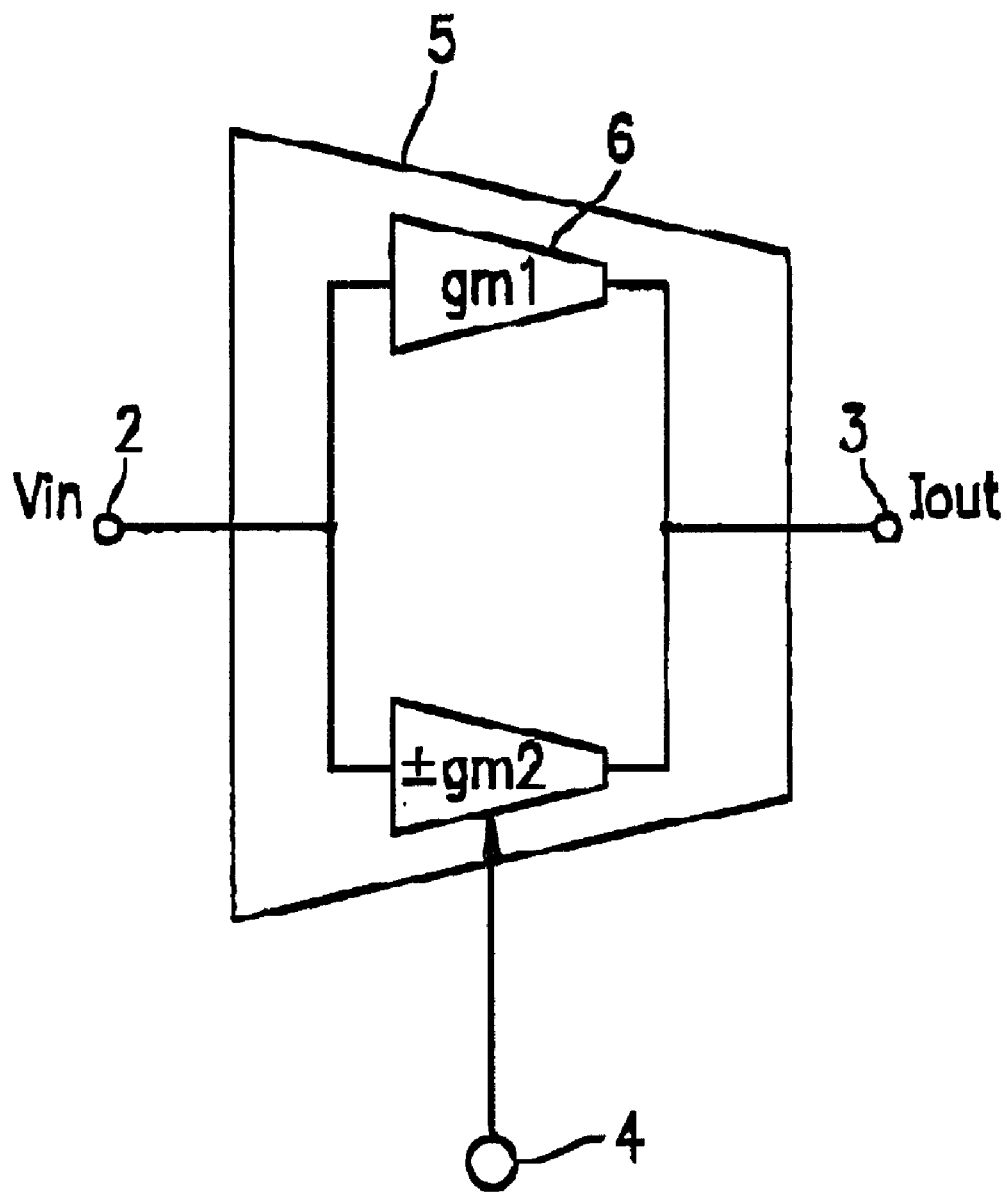
FIG. 2 shows a transconductor including two sub-transconductors according to the present invention.

FIG. 2 shows a transconductor 5 having two sub-transconductors 6. The two sub-transconductors 6 respectively have transconductances gm1 and gm2. By the combination of the transconductances gm1 and gm2, a wide variation range is achieved for the transconductance gm of the transconductor 5. In this case, the relationship between the input voltage and the output current in the transconductor 5 is represented by expression (4):

$$I_{out} = (gm1 \pm gm2) \times V_{in} \quad (4)$$

When the maximum value of the transconductance of each sub-transconductor, $gm_{max}$, is about 10 times greater than the minimum value thereof, expressions (5) are obtained:

$$gm_{max}/10 \leq gm1 \leq gm_{max}$$

$$gm_{max}/10 \leq gm2 \leq gm_{max} \quad (5)$$

(It should be herein noted that the maximum values of gm1 and gm2 are equal (=$gm_{max}$) in this example, but these maximum values may be different.)

Accordingly, the variation range of transconductance of the transconductor 5 formed by the two sub-transconductors is represented by expression (6):

$$0 \leq gm1 \pm gm2 \leq 2gm_{max} \quad (6)$$

In this way, two sub-transconductors 6 are used to extend the variation range of transconductance gm of the transconductor 5.

In the case where the transconductance gm of the transconductor 5 is reduced to a small value by subtracting gm2 from gm1 in response to a control signal from a control terminal 4, it is preferably to reduce the transconductances gm1 and gm2 of the sub-transconductors 6 to required minimum values.

The reason that a required minimum value is preferable is described now. When the transconductor 5 is formed as a single circuit, the variances in transconductances gm1 and gm2 of the sub-transconductors 6 should be considered. For example, consider a case where the transconductance of each sub-transconductor 6 has 1% variance. When the transconductance gm of the transconductor 5 is obtained by adding the transconductances gm1 and gm2, the percentage of the variance likely to decrease, e.g., the transconductance gm has about 1% variance as a whole. However, on the other hand, when the transconductance gm of the transconductor 5 is obtained by subtracting transconductance gm2 from transconductance gm1 and the transconductance gm is set to a small value, the percentage of the variance may increase by 10 times or by several tens of times. For the purpose of preventing the increase in variance, the transconductances gm1 and gm2 of the sub-transconductors 6 are reduced to required minimum values. In this way, even when the transconductance gm of the transconductor 5 is obtained by subtraction, the increase in variance of the transconductance gm can be suppressed. A method of fine adjustment to the transconductance gm for decreasing the variance thereof is described in embodiment 5.

Figure 3:
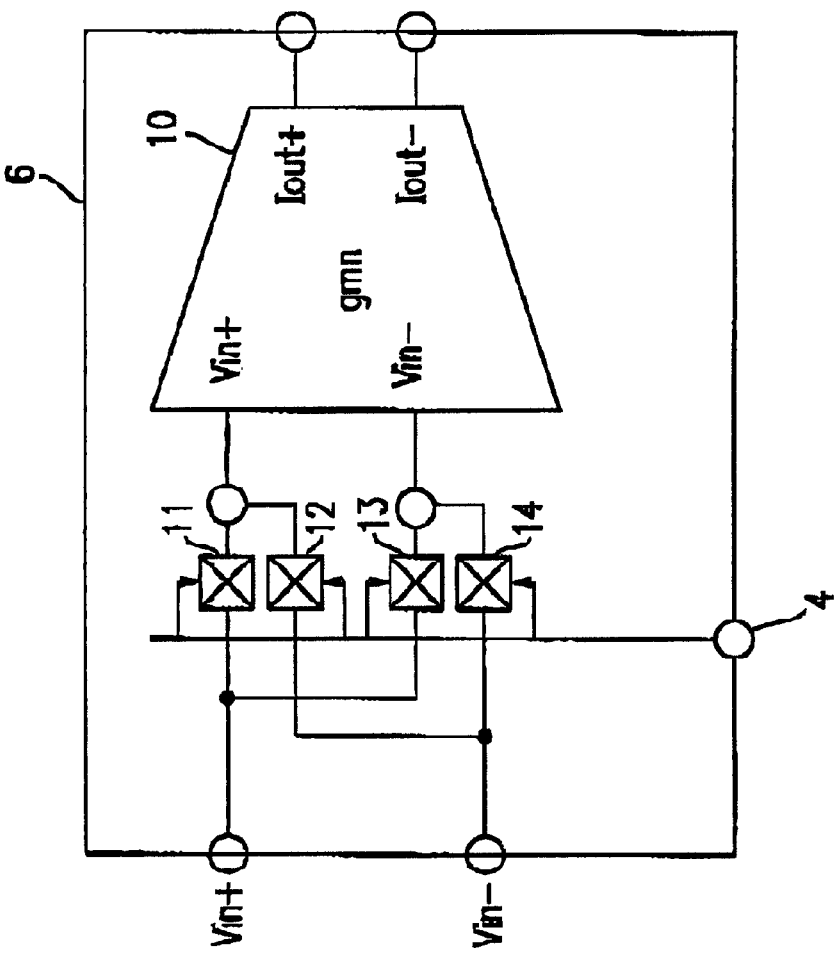
FIG. 3 shows a circuit diagram of a sub-transconductor which is a differential input/output transconductor according to the present invention.
Figure 3:
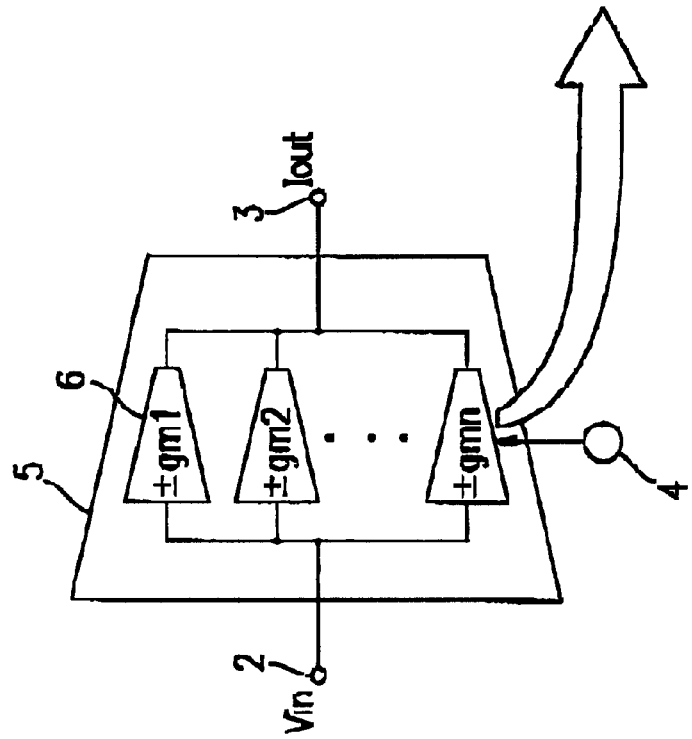

FIG. 3 is a circuit diagram showing a detailed structure of one of the sub-transconductors 6 in the transconductor 5 of the filter circuit 1. The sub-transconductors 6 includes a differential input/output transconductor 10. A positive input terminal $V_{in}+$ of the differential input/output transconductor 10 is connected to two switches 11 and 12. Similarly, a negative input terminal $V_{in}-$ of the differential input/output transconductor 10 is connected to two switches 13 and 14. The switches 11 and 13 are connected to a positive input terminal $V_{in}+$ of the sub-transconductor 6. The switches 12 and 14 are connected to a negative input terminal $V_{in}-$ of the sub-transconductor 6. Each of the switches 11–14 is controlled by a control signal from a control terminal 4. Any switching means can be employed for the switches 11–14 as long as it can be controlled by the control signal. Furthermore, the difference between a voltage input to the positive input terminal $V_{in}+$ and a voltage input to the negative input terminal $V_{in}-$ of the sub-transconductor 6 is equal to an input voltage $V_{in}$ at an input terminal 2.

A plurality of sub-transconductors 6 having the above structure are connected in parallel to one another to form the transconductor 5.

In each sub-transconductors 6, the voltage input to the differential input/output transconductor 10 is inverted by the switches 11–14. Therefore, the sign (+/−) of transconductance of the differential input/output transconductor 10 can be switched. Any circuit structure can be employed for the differential input/output transconductor 10.

Thus, with the switches 11–14, the sub-transconductors 6 can be effectively utilized. As a result, the number of nodes in the circuit and the circuit area can be reduced.

In the case where the sub-transconductor 6 is formed by a CMOS transistor, an input terminal of the sub-transconductor 6 is a gate of the CMOS transistor, and only a gate capacitance receives a signal. Therefore, a current flowing from the input terminal of the CMOS transistor to the sub-transconductor 6 is very small, and accordingly, deterioration of characteristics due to on-resistance of the switches 11 and 13 can be suppressed.

Since the transconductance of each sub-transconductor 6 can be inverted by the switches 11–14, the transconductance of the transconductor 5 can be changed without increasing the number of the sub-transconductors 6. As a result, the number of circuits which form the transconductor 5 and the circuit area can be reduced.

The transconductance of the sub-transconductor 6 typically has a variation range wherein the maximum limit is about 10 times greater than the minimum limit, and can be changed to any value within this variation range. Therefore, the transconductance of the transconductor 5 can be changed to any value within the variation range as long as the transconductance of the sub-transconductor 6 is changed to any value within the above variation range: otherwise, the transconductance of the transconductor 5 may not be appropriately changed by switching the sign of the transconductance of the transconductor 6.

In a disk processing system such as a DVD system, etc., when the types of recording media are changed, or when the multiple speed mode (processing speed) is changed, it is necessary to widely change a transconductance gm. In such a case, however, it is only necessary to change the transconductance gm temporarily when the change is required. Thus, a filter circuit according to the present invention can be applied to such a disk processing system without any difficulty.

Furthermore, it is possible to provide a negative transconductance for the transconductor 5 by subtracting the transconductances of the sub-transconductors 6. Accordingly, the sign of an output from the filter circuit 1 can be inverted, and the filter characteristics can be considerably changed.

According to embodiment 1 of the present invention, in a filter circuit 1 including a transconductor 5 and a capacitor 7, the transconductor 5 is formed by a plurality of sub-transconductors 6 which are connected in parallel to one another. By adding or subtracting the transconductances of the sub-transconductors 6, the entire transconductance of the transconductor 5 can be widely varied. The sub-transconductors 6 to be added or subtracted are selected by a control signal from a control terminal 4. Furthermore, since the variation of transconductance of the transconductor 5 influences the filter characteristics such as the Q-factor, the cutoff frequency $F_C$, etc., it is also possible to widely change the filter characteristics by appropriately changing the transconductance of the transconductor 5. Moreover, since a large capacitor is not required, the device area does not increase.

Embodiment 2

Hereinafter, embodiment 2 of the present invention will be described with reference to FIGS. 4 to 7.

Figure 4:
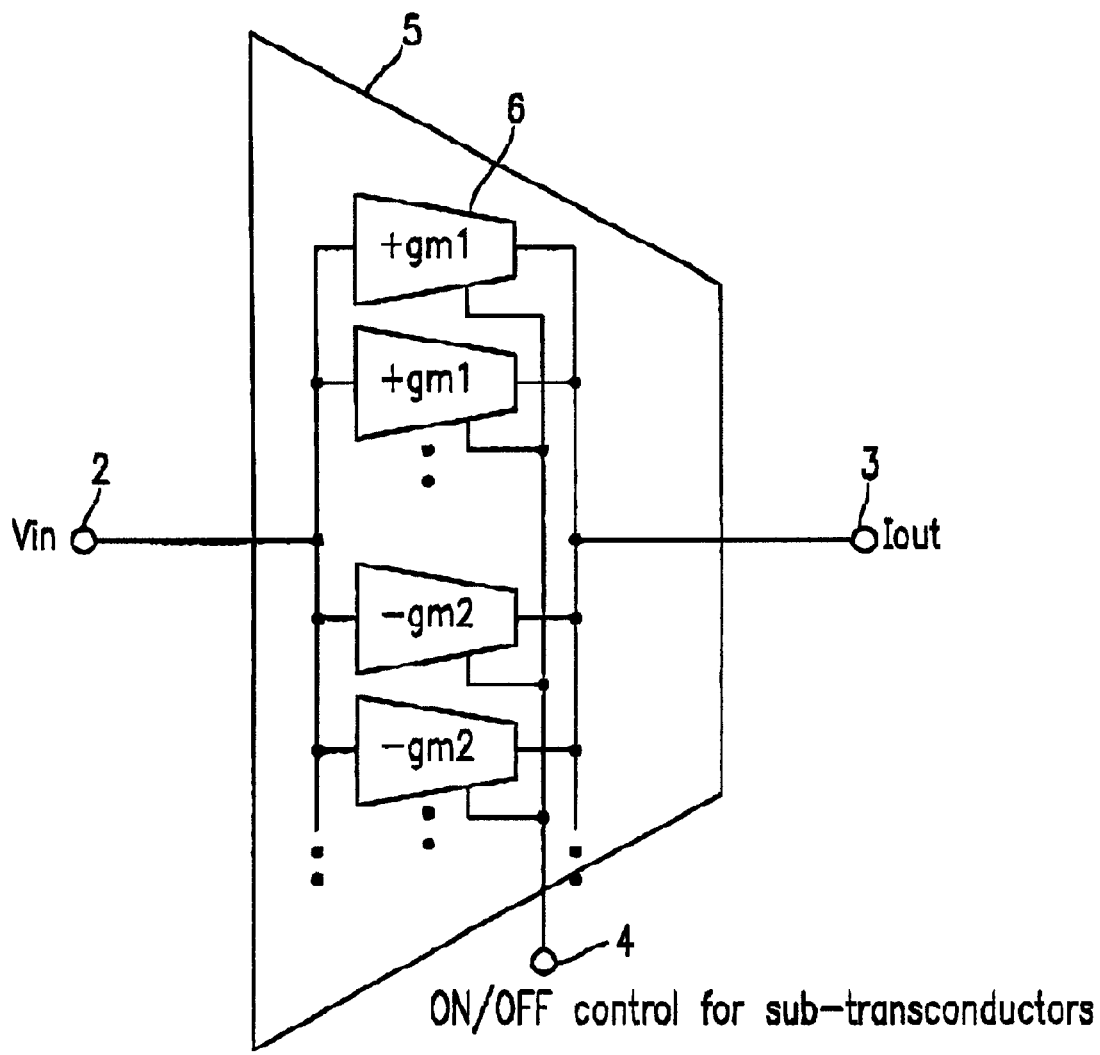
FIG. 4 shows a transconductor including a plurality of sub-transconductors according to the present invention.

FIG. 4 shows a transconductor 5 including a plurality of positive sub-transconductors (+gm1) and a plurality of negative sub-transconductors (−gm2) which are connected in parallel to one another. (In embodiment 2, each of the sub-transconductors 6 has the same structure as that of the differential input/output transconductor shown in FIG. 3. However, a sub-transconductor used in a transconductor of the present invention is not limited to this type of sub-transconductor.) The operation (on/off) state of each sub-transconductor 6 is selected by a control signal from a control terminal 4. Based on the operation state, the transconductance of the sub-transconductor 6 is selected.

In the transconductor 5 having such a structure, when the negative transconductors are off, the transconductance gm of the transconductor 5 is obtained by addition; when the negative transconductors are on, the transconductance gm of the transconductor 5 is obtained by subtraction.

The negative sub-transconductor (−gm2) is easily achieved by inversely connecting the input terminals of the differential input/output transconductor in the positive sub-transconductor (+gm1) (i.e., the positive and negative input terminals are replaced with each other).

Figure 5:
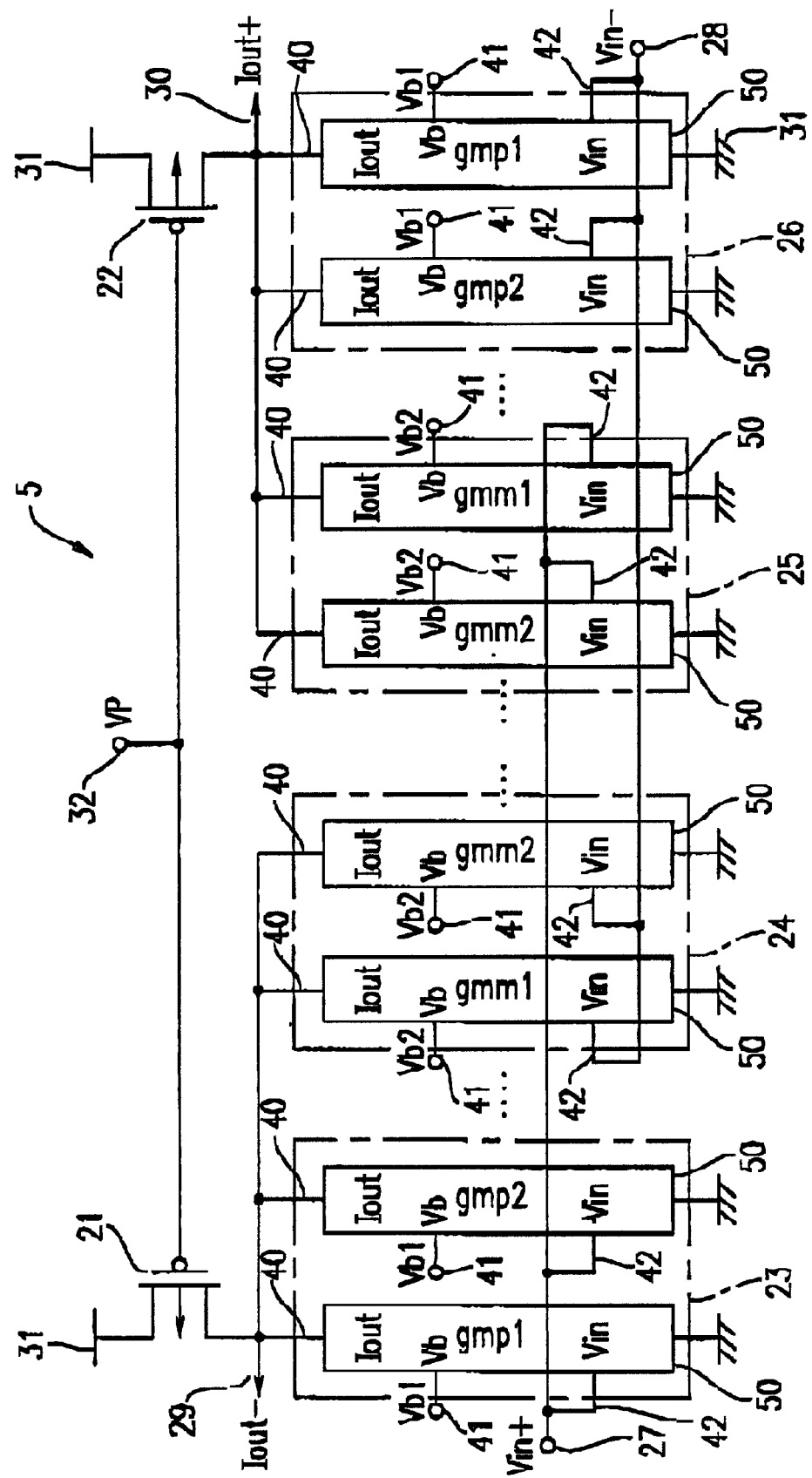
FIG. 5 is a detailed circuit diagram showing the transconductor of FIG. 4.

A detailed circuit structure of the transconductor 5 is shown in FIG. 5. The structure of the transconductor 5 shown in FIGS. 4 and 5 (embodiment 1) is different form the structure of the transconductor 5 shown in FIG. 3 (embodiment 1) in that, in the transconductor 5 shown in FIGS. 4 and 5, it is possible to select addition or subtraction of the transconductance of the sub-transconductors 6 without providing a switch which would cause an error in a signal path for a control signal. In such a structure, more ideal filter characteristics can be obtained. Therefore, such a transconductor can be preferably used in a filter circuit which operates at a very high speed, a high precision filter circuit, etc.

Now, the circuit structure of the transconductor 5 shown in FIG. 5 according to embodiment 2 will be described in detail.

A transconductor 5 of FIG. 5 includes a first P-MOS transistor 21 and a second P-MOS transistor 22. Sources of the first and second P-MOS transistors 21 and 22 are connected to a power supply 31 (having a first polarity), and gates of the first and second P-MOS transistors 21 and 22 are connected to a first bias terminal 32. This bias terminal 32 is typically connected to a common feedback circuit (not shown) which controls a common mode voltage at a differential output terminal.

A drain of the first P-MOS transistor 21 is connected to sub-transconductor components 23 and 24 and a negative output terminal 29. A drain of the second P-MOS transistor 22 is connected to sub-transconductor components 25 and 26 and a positive output terminal 30. Each of the sub-transconductor components 23 to 26 includes a pair of unit transconductors 50. However, a sub-transconductor component including only one unit transconductor is within the scope of the present invention. The sub-transconductor components 23 and 26 form a sub-transconductor which corresponds to any of the sub-transconductors 6 shown in FIG. 4. Similarly, the sub-transconductor components 24 and 25 form a sub-transconductor which corresponds to any of the sub-transconductors 6 shown in FIG. 4.

Figure 6:
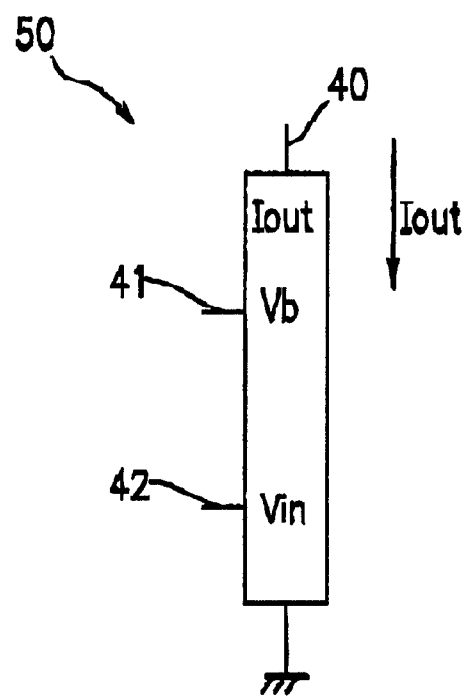
FIG. 6 shows one of unit transconductors included in the transconductor of FIG. 5.

FIG. 6 shows one of the unit transconductors 50. The unit transconductors 50 of FIG. 6 outputs an output voltage which is proportional to an input voltage received at an input terminal 42 from an output terminal 40. A control signal received at a control terminal 41 controls the transconductance $gm_{unit}$ of the unit transconductors 50 or turns the unit transconductors 50 into a non-operation state. (For simplicity, only one control terminal 41 is shown in FIG. 6; however, a plurality of control terminals 41 may be provided according to a circuit structure.)

Figure 7:
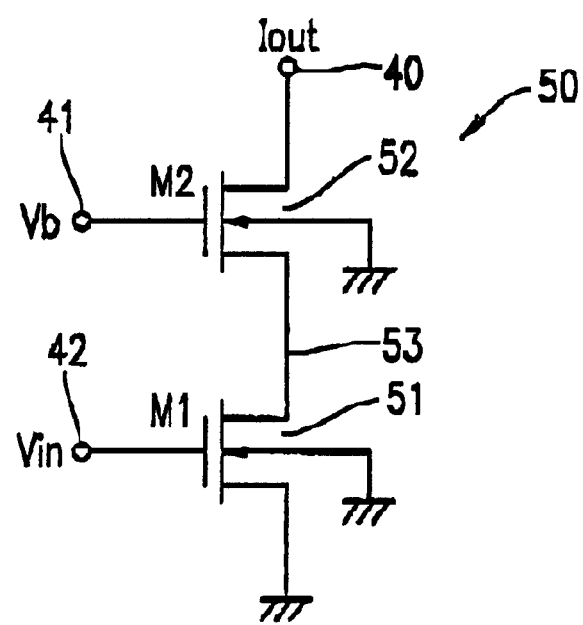
FIG. 7 is an exemplary circuit diagram of the unit transconductor shown in FIG. 6.

An exemplary structure of the unit transconductors 50 is shown in FIG. 7. In the unit transconductors 50, a first N-MOS transistor 51 and a second N-MOS transistor 52 are connected in serial through a node 53. A drain of the second N-MOS transistor 52 is connected to an output terminal 40. An input terminal 42 is connected to a gate of the first N-MOS transistor 51. The first N-MOS transistor 51 generates a current $I_{out}$ which is proportional to an input voltage $V_{in}$. The generated current $I_{out}$ is output from the output terminal 40 which is connected to the drain of the second N-MOS transistor 52. A gate of the second N-MOS transistor 52 is connected to a control terminal 41. A source of the first N-MOS transistor 51 is connected to a ground (power supply having a second polarity).

It should be noted that for simplicity, only one control terminal 41 and one input terminal 42 are shown in FIG. 7; however, a plurality of control terminals 41 and a plurality of input terminals 42 may be provided according to a circuit structure of the unit transconductors 50.

In such a structure, the transconductance $gm_{unit}$ of the unit transconductors 50 is equal to the transconductance of the first N-MOS transistor 51. The first N-MOS transistor 51 carries out an unsaturated operation. In the first N-MOS transistor 51, the relationship among a gate-source voltage $V_{in}$, a drain-source voltage $V_{ds}$, and a drain current $I_{out}$ is represented by expression (7):

$$I_{out}=\beta(V_{in}-V_{th}-V_{ds}/2)\times V_{ds} \quad (7)$$

where $\beta$ denotes a conductance parameter of the second N-MOS transistor 52: and $V_{th}$ denotes a threshold voltage of the second N-MOS transistor 52.

Accordingly, the transconductance $gm_{unit}$ of the unit transconductors 50 is represented by expression (8):

$$gm_{unit} = \partial I_{out}/\partial V_{in} = \beta \times V_{ds} \quad (8)$$

The transconductance $gm_{unit}$ of the unit transconductor 50 can be controlled by the drain-source voltage $V_{ds}$, i.e., a voltage at the node 53.

Moreover, in the case where a control voltage input to the control terminal 41 is set to a ground level, the second N-MOS transistor 52 is in a cutoff state. As a result, the output current of the unit transconductor 50 is continuously maintained at zero, i.e., is in a non-operation state. Thus, the control voltage input to the control terminal 41 controls the transconductance $gm_{unit}$ of the unit transconductor 50, and on the other hand, controls the operation (on/off) state of the unit transconductor 50.

The second N-MOS transistor 52 controls the transconductance of the first N-MOS transistor 51. A voltage which is smaller than the control voltage input to the control terminal 41 by about the threshold voltage $V_{th}$ of the second N-MOS transistor 52 is equal to a voltage of the node 53. In such a structure, the transconductance of the first N-MOS transistor 51 can be controlled based on the control voltage input to the control terminal 41.

As shown in FIG. 5, each of the sub-transconductor components 23–26 includes a pair of unit transconductors 50 having the above structure. In the sub-transconductor components 23 and 24, an output terminal 40 of each unit transconductor 50 is connected to a negative output terminal 29. In the sub-transconductor components 25 and 26, an output terminal 40 of each unit transconductor 50 is connected to a positive output terminal 30. In the description below, where a current flows into a sub-transconductor component, the direction of the current is referred to as "a positive direction", or in this case, "the sub-transconductor component has a positive conductance".

In the sub-transconductor components 23 and 25, an input terminal 42 of each unit transconductor 50 is connected to a positive input terminal 27. To each input terminal 42, a positive input voltage $V_{in}+$ is input from a positive input terminal 27.

In the sub-transconductor components 24 and 26, an input terminal 42 of each unit transconductor 50 is connected to a negative input terminal 28. To each input terminal 42, a negative input voltage $V_{in}-$ is input from a negative input terminal 28.

Output terminals 40 of the sub-transconductor components 23 and 24 are connected to a negative output terminal 29. Output terminals 40 of the sub-transconductor components 25 and 26 are connected to a positive output terminal 30.

Thus, in the sub-transconductor formed by the sub-transconductor components 23 and 26, a current flows in the positive direction, i.e., the sub-transconductor formed by the sub-transconductor components 23 and 26 has a positive transconductance. On the other hand, in the sub-transconductor formed by the sub-transconductor components 24 and 25, a current flows in the negative direction, i.e., the sub-transconductor formed by the sub-transconductor components 24 and 25 has a negative transconductance.

In such a structure, the transconductance gm of the transconductor 5 is represented by expression (9):

$$I_{out} = (gmp1 + gmp2 + \ldots - gmm1 - gmm2 \ldots) \times V_{in} \quad (9)$$

In this way, addition or subtraction of the transconductances is carried out among the sub-transconductors formed by the sub-transconductor components 23 and 26 and the sub-transconductor components 24 and 25, whereby the transconductance of the transconductor 5 can be determined.

In expression (9), "gmp1+gmp2" is the transconductance of the sub-transconductor formed by the sub-transconductor components 23 and 26; and "−gmm1−gmm2" is the transconductance of the sub-transconductor formed by the sub-transconductor components 24 and 25. As shown in FIG. 5, according to a typical operation of a differential input/output circuit, the sub-transconductor formed by the sub-transconductor components 23 and 26 and the sub-transconductor formed by the sub-transconductor components 24 and 25 are designed so as to have the same transconductance gm. As described above, in each unit transconductor 50, it is possible to change the transconductance $gm_{unit}$ of the unit transconductor 50 by the control voltage Vb1 or Vb2 input to the control terminal 41.

For example, the unit transconductor 50 shown in FIG. 7 has a variation range of the transconductance $gm_{unit}$ in which the maximum limit is about 10 times greater than the minimum limit. Moreover, as described above, the unit transconductor 50 is turned into a non-operation state by changing the control voltage, whereby the transconductance $gm_{unit}$ of the unit transconductor 50 can be set to zero. Thus, according to expression (9), the transconductor 5 can have a transconductance which is variable within a very wide range from a positive transconductance to a negative transconductance.

In the case where every transconductance ($gm_{unit}$) is a positive value, the transconductance gm of the transconductor 5 is simply a total of the transconductances of the unit transconductors 50. In this case, the variation range of the transconductance gm is equal to that of the transconductance $gm_{unit}$. However, according to the present invention, a combination of positive transconductances and negative transconductances provides an extended variation range of the transconductance gm. As a result, the types of applications for which the transconductor according to the present invention can be used is increased.

In a GM-C filter circuit, the transconductance gm of a transconductor controls important parameters of the filter circuit such as the cutoff frequency $F_c$, the Q-factor, etc. With an extended variation range of the transconductance gm, the filter characteristics can be widely changed. For example, a magneto-optical disk system needs to have a variation range of a cutoff frequency $F_c$ which is much greater than a conventional variation range wherein the maximum limit is about 10 times greater than the minimum limit, in order to ensure compatibility with various media or to change the accessing speed. A filter circuit according to embodiment 2 of the present invention is preferably used in such an application.

In a filter circuits according to embodiment 2, it is possible to provide a circuit structure in which a P-channel and a N-channel are replaced with each other while the power supply and the ground is replaced with each other.

Moreover, in a filter circuit according to embodiment 2, since a switch is not provided in a signal path, more ideal filter characteristics can be achieved.

Embodiment 3

Hereinafter, embodiment 3 of the present invention will be described with reference to FIG. 8.

Figure 8:
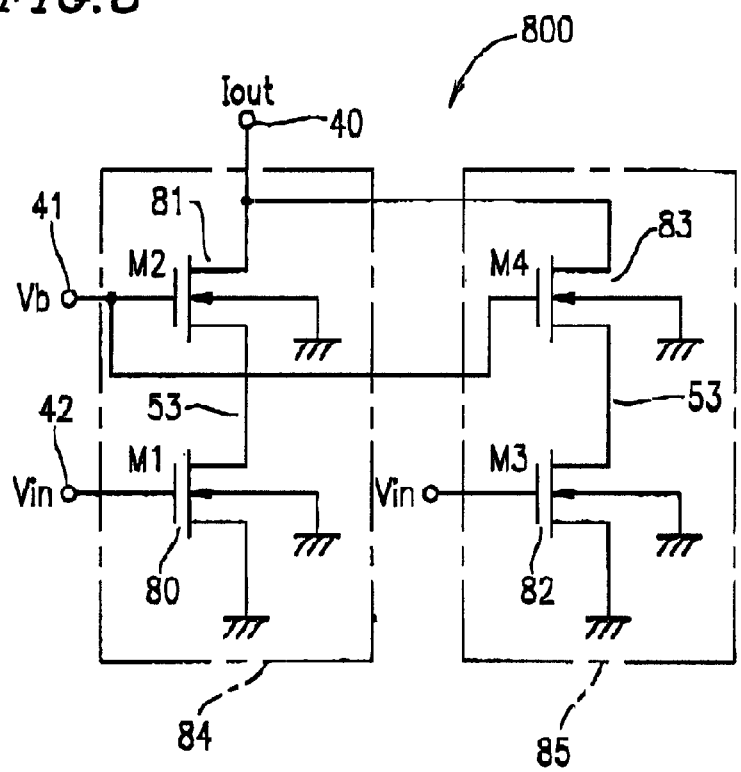
FIG. 8 is a circuit diagram showing another example of a unit transconductor.

FIG. 8 shows a unit transconductor 800 including two unit transconductors 84 and 85 which are connected in parallel to each other. (The unit transconductors 84 and 85 each have substantially the same structure as that of the unit transconductor 50 shown in FIG. 7.) With such a structure shown in FIG. 8, a high-speed operation of the unit transconductor 800 is maintained, and the linearity of the relationship between an input voltage and an output current improves. A gate of transistor 81 in the unit transconductor 84 and a gate of transistor 83 in the unit transconductor 85 are connected together to a control terminal 41. The transconductance of the unit transconductor 800 having such a structure is a sum of the transconductance of a transistor 80 in the unit transconductor 84 and the transconductance of a transistor 82 in the unit transconductor 85. Sources of the transistors 80 and 82 are grounded.

Now, an operation of the unit transconductor 800 is described.

In a unit transconductor 50 formed by a pair of transistors 51 and 52 as shown in FIG. 7, the transconductance $gm_{unit}$ is controlled by a voltage at a node 53. The voltage at a node 53, $V_{n53}$, is represented by expression (10):

$$V_{n53} = Vb - V_{gs2} \quad (10)$$

where Vb denotes a voltage at the control terminal 41; and $V_{gs2}$ denotes a gate-source voltage of the transistor 52.

As seen from expression (10), the gate-source voltage $V_{gs2}$ of the transistor 52 is substantially equal to the threshold voltage of the transistor 52. However, the gate-source voltage $V_{gs2}$ varies according to a drain current of the transistor 51, i.e., an output current of the transconductor 50. According to the variation of the gate-source voltage $V_{gs2}$, the voltage at the node 53 is varied. As a result, it is possible that the relationship between the input voltage and the output current will be distorted, and accordingly, it is possible that the linearity of the transconductance of the sub-transconductor formed by the unit transconductors will be deteriorated.

On the other hand, in the unit transconductor 800 formed by the unit transconductor 84 including the transistors 80 and 81 and the unit transconductor 85 including the transistors 82 and 83 as shown in FIG. 8, the transistor 81 has a different size from the transistor 83. Therefore, the gate-source voltage of the transistor 81 is different from that of the transistor 83. Accordingly, distorted curves for the transconductances of the transistor 80 and the transistor 82 are different from each other. Thus, by appropriately selecting the sizes of the transistors 81 and 83, the distortions of the transconductances of the transistors 80 and 82 are counteracted by each other, whereby a transconductor formed by sub-transconductors each having a transconductance with improved linearity are achieved.

The unit transconductor 800 shown in FIG. 8 has all the features of the unit transconductor 50 shown in FIG. 7. The unit transconductor 800 can be used to construct the transconductor 5 of FIG. 5 and the filter circuit 1 of FIG. 1A.

As described above, in the unit transconductor 800 of FIG. 8, the unit transconductors 84 and 85 are connected in parallel to each other. With such a structure, only the linearity of the relationship between the input voltage and the output current can be improved without decreasing the processing speed of circuits included in the unit transconductor 800.

As described above, in a filter circuit which uses the unit transconductor 800 according to embodiment 3, the unit transconductor 800 is formed by the unit transconductors 84 and 85 connected in parallel to each other. Moreover, the transistors 81 and 83 have different sizes. With such a structure, distorted curves for the transconductances of the transistors 80 and 82 can be different from each other. That is, distorted curves for the transconductances of the unit transconductors 84 and 85 can be different from each other. By appropriately selecting the sizes of the transistors 81 and 83, the distortions of the transconductances of the transistors 80 and 82 are counteracted by each other, whereby a sub-transconductor having a transconductance with improved linearity can be achieved.

Embodiment 4

Hereinafter, embodiment 4 of the present invention will be described with reference to FIG. 9.

Figure 9:
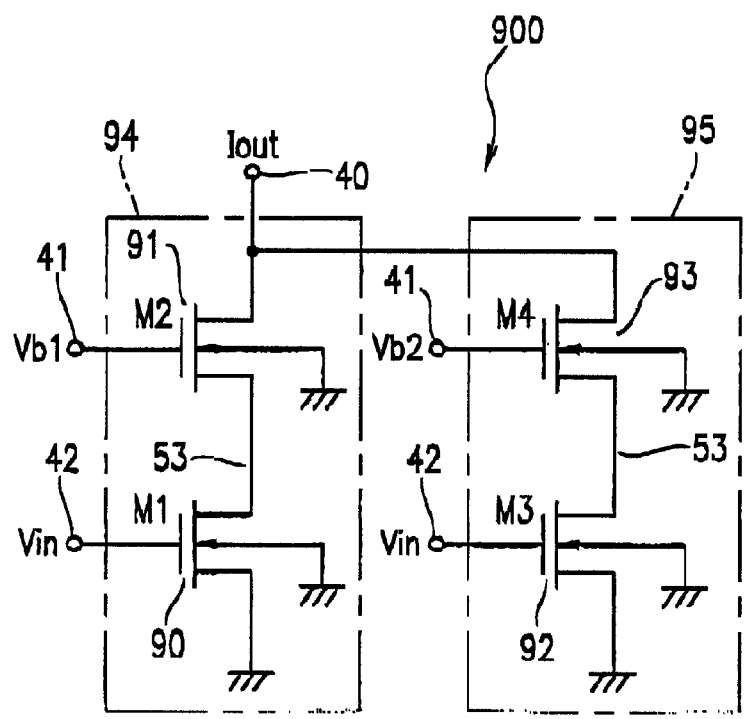
FIG. 9 is a circuit diagram showing still another example of a unit transconductor.

FIG. 9 shows a unit transconductor 900 which has substantially the same structure as the unit transconductor 800 of FIG. 8, except that control voltages to be input to the transistors 91 and 93 are different from each other. Also in the unit transconductor 900 having such a structure, as in the unit transconductor shown in FIG. 8, the linearity of the relationship between the input voltage and the output current can be improved without decreasing the processing speed for circuit operations.

In the unit transconductor 900 of FIG. 9, the sizes of the transistors 91 and 93 connected to a control terminal 41 are different. Moreover, control voltages input to transistors 91 and 93 (i.e., gate voltages) are different from each other. Accordingly, the distortions of the transconductances of the transistors 90 and 92 can be different. The control voltage input to the control terminal 41 can be adjusted so that such distortions of the transconductances counteract each other. Therefore, also in the unit transconductor 900, the linearity of the relationship between the input voltage and the output current can be improved.

Furthermore, in the unit transconductor 900 of FIG. 9, by adjusting the control voltage input to the control terminal 41, the operation (on/off) states of a path between the transistors 90 and 91 (i.e., node 53 of a unit transconductor 94) and a path between the transistors 92 and 93 (i.e., node 53 of a unit transconductor 95) are separately controlled. With such an arrangement, a smaller transconductance gm of the unit transconductor 900 as a whole can be readily achieved. As a result, the variation range for the transconductance of the unit transconductor 900 can be extended.

The unit transconductor 900 shown in FIG. 9 has all the features of the unit transconductor 50 shown in FIG. 7. Therefore, the unit transconductor 900 can be used to construct the transconductor 5 of FIG. 5 and the filter circuit 1 of FIG. 1A.

As described above, in a filter circuit which uses the unit transconductor 900 according to embodiment 4, the two transistors used therein have different sizes as in embodiment 3; and in addition, the control voltages input to these transistors (i.e., gate voltages) are also different. In such a structure, the control voltages are appropriately adjusted such that the distortions of the transconductances of these transistors are counteracted by each other, whereby the linearity of the relationship between the input voltage and the output current are improved.

Embodiment 5

Hereinafter, embodiment 5 of the present invention will be described with reference to FIG. 10.

A filter circuit 1000 according to embodiment 5 is formed by a plurality of GM-C filter circuits each including a transconductor 5 and a capacitor 7. For simplicity, FIG. 10 shows two GM-C filter circuits as being connected in a cascade-connection manner; however, in a filter circuit according to embodiment 5, a plurality of GM-C filter circuits may be connected in any connection manner, such as a ladder-connection, according to the purpose of the filter circuit. The filter circuit 1000 is designed such that the transconductance gm of each transconductor 5 can be measured. The characteristics of the filter circuit 1000 are determined by the capacitance C of the capacitor 7 and the transconductance gm of the transconductors 5. In order to obtain desired characteristics with high precision, it is necessary to use transconductors each having a desired transconductance gm and capacitors each having a desired capacitance. However, in the case where the transconductance gm of each transconductor 5 has some variance, desired characteristics may not be obtained. Thus, in order to obtain a high-precision filter, it is necessary to minimize the variance in the transconductance gm of each transconductor 5.

Figure 10:
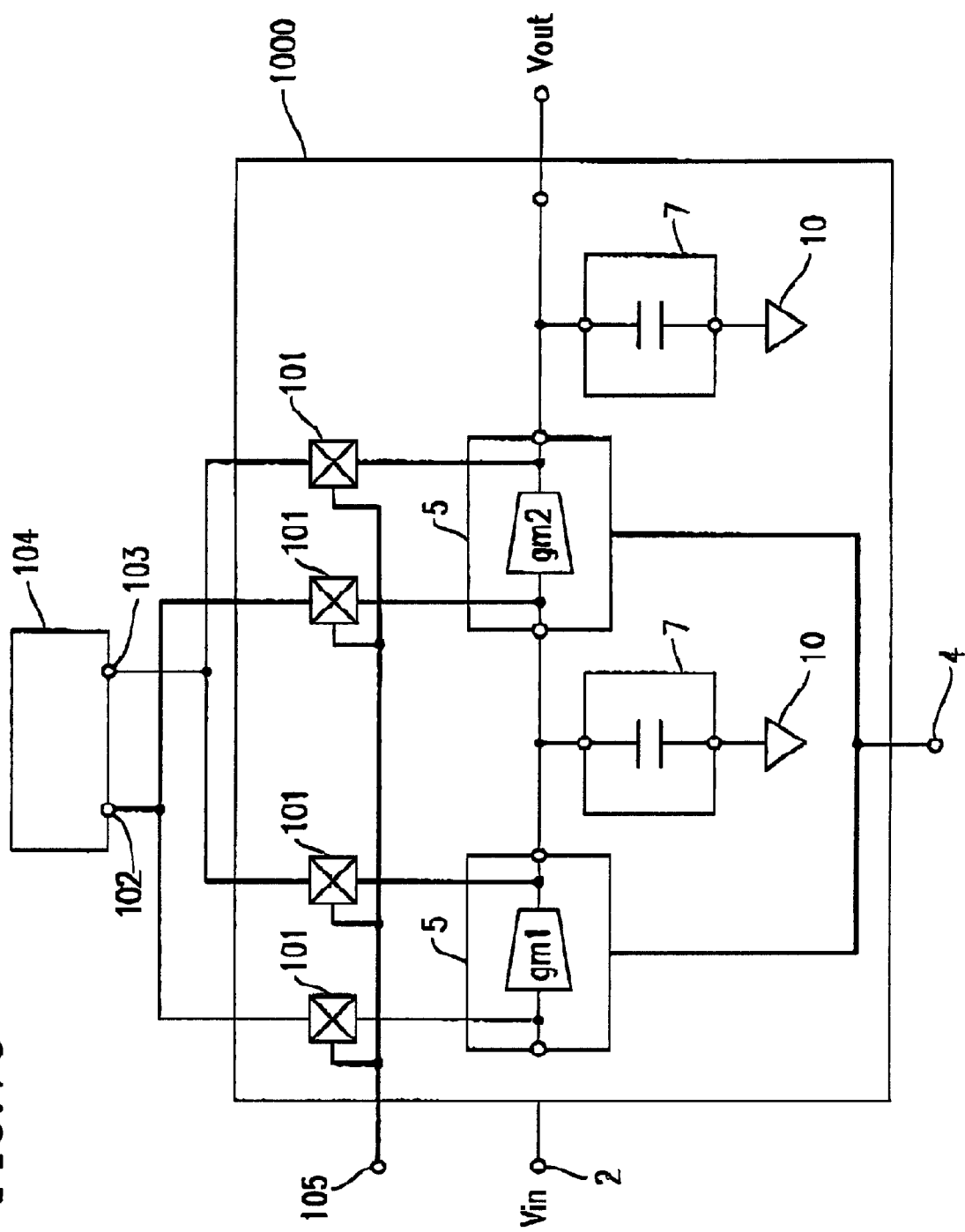
FIG. 10 shows another example of a filter circuit according to the present invention.
Figure 11:
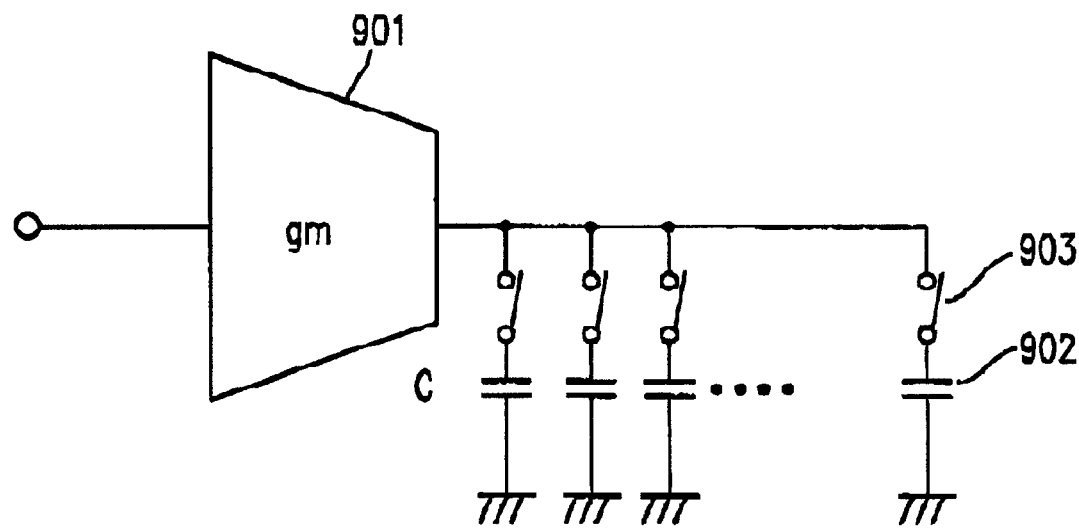
FIG. 11 shows a structure of a conventional filter circuit.

To this end, the filter circuit 1000 shown in FIG. 10 is designed such that the transconductance gm of each transconductor 5 is measured, and a variance in the measured transconductance gm is corrected by finely tuning the transconductance gm.

As described in embodiments 1–4, especially in the case where the transconductance gm of each transconductor 5 is determined by subtraction of the transconductances of sub-transconductors 5, the variance in the transconductance of the transconductor 5 increases. Thus, measurement means for measuring transconductance gm and fine adjustment of transconductance gm, which will be described later, are very important factors. In other words, by employing a transconductor according to any of embodiments 1–4 of the present invention in the filter circuit 1000 shown in FIG. 10, a filter circuit which has finely adjustable, widely variable characteristics can be obtained with maintaining a high-speed operation.

Further, in order to obtain a fast, CMOS transistor-based filter circuit, it is necessary to increase the operation speed of a transconductor. Therefore, it is necessary to employ a MOS transistor having a relatively short gate length. However, as a side effect, the variance in transconductance increases, and accordingly, the accuracy of filtering decreases. In such a high-speed filter circuit 1000 according to embodiment 5, the variance in transconductance can be decreased while maintaining a high-speed operation.

In the filter circuit 1000 of FIG. 10, an input terminal and an output terminal of each transconductor 5 are connected through switches 101 to external terminals 102 and 103, respectively. Among the plurality of switches 101, switches 101 which are connected to the input terminals of the transconductors 5 (first switches) are connected to the external terminal 102 of measurement means 104 (which will be described later), and switches 101 which are connected to the output terminals of the transconductors 5 (second switches) are connected to the external terminal 103 of the measurement means 104. Furthermore, a second control signal from a second control terminal 105 (in this case, a control terminal having a bus structure) is input to the switches 101 which are connected to the input terminals of the transconductors 5 (first switches) and the switches 101 which are connected to the output terminals of the transconductors 5 (second switches). An input voltage is input to each input terminal, and an output current is output from each output terminal. The operation (on/off) state of each transconductor 5 is controlled by a first control signal from a control terminal 4 (in this case, a control terminal having a bus structure).

In the filter circuit 1000 having such a structure, in response to the second control signal input to the switches 101, during a normal filtering operation, all of the switches 101 are off; and when the transconductance of a specific transconductor is measured, the switches 101 activate the specific transconductor. The second control signal received by each switch 101 controls the operation (on/off) state of the switch 101. For simplicity, only one control signal is shown in FIG. 10; however, a plurality of control signals may be used as long as the switches 101 can be appropriately controlled. Moreover, the switch 101 could be any switching means as long as the operation of the switching means can be controlled by a control signal.

When the transconductance gm of any of the transconductors 5 is measured, in the first step, transconductors other than a selected transconductor whose transconductance is to be measured are turned off by a control signal from the control terminal 4. However, not all the transconductors whose transconductances are not to be measured are necessarily turned off. It is only necessary to turn off transconductors whose input terminal or output terminal is directly connected to an input or output terminal of the selected transconductor.

Thereafter, switches 101 which are respectively connected to an input terminal and an output terminal of the selected transconductor are turned on, whereby the input terminal and the output terminal of the selected transconductor are connected to the external terminal 102 and the external terminal 103 of the measurement means 104. The measurement means 104 supplies a predetermined voltage to the input terminal of the selected transconductor, and then measures a current output from the selected transconductor. Based on the ratio between the input voltage and the measured current, the transconductance gm of the selected transconductor is determined. In this way, an actual transconductance gm of each transconductor can be measured. Thus, even when the transconductance gm of each transconductor has a relatively large variance, the variance can be eliminated by adjusting the transconductance gm of each transconductor based on the measured transconductance. As a result, desired filter characteristics can be obtained.

As described above, in the filter circuit 1000 according to embodiment 5, when the transconductance gm of the selected transconductor is measured, it is necessary to turn off transconductors whose input terminal or output terminal is directly connected to the input or output terminal of the selected transconductor. For example, each of the sub-transconductor components 23–26, i.e., the transconductor 5 shown in FIG. 5 has a structure which fills such a requirement, and accordingly is applicable to the filter circuit 1000 according to embodiment 5. Furthermore, a transconductor having any other circuit structure may be employed as long as the above requirement is satisfied; and even in such a case, the effects of the filter circuit 1000 according to embodiment 5 are obtained. However, when the circuit employed has a switch in a signal path for turning off the transconductor, characteristics of the transconductor deteriorate, causing some trouble in producing a high speed, high precision filter. Thus, the transconductor 5 shown in FIG. 5 is suitable for a filter circuit according to embodiment 5 because the transconductor 5 can be turned off by a control signal although a switch is not provided in a signal path.

As described in embodiments 2–4, the transconductance gm of each transconductor 5 can be finely adjusted by finely adjusting a control voltage (current) for controlling the transconductance of each sub-transconductor included in the transconductor 5. For example, in the transconductor 5 shown in FIG. 5, a control voltage supplied to a control terminal 41 of each of sub-transconductor components 23–26 is finely adjusted. In the unit transconductor 50 shown in FIG. 7, a control voltage supplied to a control terminal 41 is finely adjusted, whereby the transconductance of the unit transconductor 50 is controlled.

Further, for the switches 101, it is preferable to employ a switch with a small parasitic capacitance in order to minimize influences on the filter characteristics.

In the filter circuit 1000 according to embodiment 5, an input terminal and an output terminal of each transconductor 5 are connected through switches 101 to external terminals 102 and 103, respectively. However, a plurality of input terminals and output terminal may be provided to each transconductor 5, or the input terminal and the output terminal of each transconductor 5 may be connected through a plurality of switches 101 to external terminals 102 and 103, respectively, as long as the transconductance of each transconductor 5 can be separately measured.

In the filter circuit 1000 according to embodiment 5, the input terminal and the output terminal of each transconductor 5 is connected to the switches 101 on the one-to-one basis. Moreover, the output terminal of each transconductor is connected to an input terminal of another transconductor. Thus, in such a structure, in view of area efficiency and influences on the filter characteristics, it is preferable to share lines in order to reduce the total line length in the circuit.

Thus, in the filter circuit 1000 according to embodiment 5, in order to obtain a high-precision filter, the transconductance gm of each transconductor 5 is measured, and the transconductance gm is finely adjusted based on the measured value so that the variance of the transconductance gm is corrected, thereby reducing nonuniformity of the device characteristics. Therefore, even in a high-speed filter, the variance of the transconductance can be reduced while maintaining a high-speed operation.

As described above, a transconductor according to the present invention includes a plurality of sub-transconductors which are connected in parallel to one another. At least one of the plurality of sub-transconductors is controlled by a control signal so as to have a negative transconductance. With such a structure, it is possible to widely change the transconductance of the transconductor.

In such a transconductor according to the present invention, the plurality of sub-transconductors may be a plurality of differential input/output transconductors. In each differential input/output transconductor, a voltage input to the differential input/output transconductor is inverted by switches, whereby the sign (+/−) of transconductance of the differential input/output transconductor can be selected. That is, with such switches, a negative transconductance can easily be obtained. In such a structure, the sub-transconductors can be utilized effectively, and as a result, the number of nodes in the circuit and circuit area can be reduced.

Furthermore, according to another embodiment of the present invention, a transconductor includes one or more positive transconductors and one or more negative transconductors, and each of these transconductors can be separately turned on/off by a control signal without providing a switch in a signal path. In such a structure, a high-speed operation is not deteriorated because no switch is provided in the signal path.

Furthermore, in a filter circuit including a transconductor according to the present invention and a capacitor connected thereto, it is possible to widely change the filtering characteristics such as the cutoff frequency, the Q-factor, etc. As a result, more ideal filtering characteristics can be obtained.

Still further, in a filter circuit according to still another embodiment of the present invention, it is possible to measure the transconductance of each transconductor including a plurality of sub-transconductors. The transconductance of each transconductor is corrected using the measurement result so as to minimize the variance of the transconductance. Thus, even in the case where the transconductance of each transconductor is determined by subtraction of transconductances of sub-transconductors, and the transconductance of each sub-transconductor has a large variance, a high-precision, high-speed filter circuit can be achieved by correction for transconductance.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A transconductor which has a transconductance gm and which receives an input voltage $V_{in}$ and outputs in response to the input voltage $V_{in}$ an output current $I_{out}$ of $gm \times V_{in}$, wherein:

the transconductor includes a plurality of sub-transconductors which are connected in parallel to one another; and at least one control signal is input to the plurality of sub-transconductors, and the plurality of sub-transconductors are controlled by the at least one control signal such that at least one of the plurality of sub-transconductors has a negative transconductance, whereby the transconductance gm of the transconductor can be varied.

2. A transconductor according to claim 1, wherein the at least one of sub-transconductors includes a differential input/output transconductor and a plurality of switching sections, the plurality of switching sections are connected to a first input terminal and a second input terminal of the differential input/output transconductor, and the plurality of switching sections are switched in response to the at least one control signal, thereby switching a sign of a transconductance of the differential input/output transconductor.

3. A transconductor according to claim 1, wherein:

the plurality of sub-transconductors include one or more first sub-transconductors having a first polarity transconductance and one or more second sub-transconductors having a second polarity transconductance; and an operation (on/off) state of each of the one or more first and second sub-transconductors is selectively switched by the at least one control signal.

4. A transconductor according to claim 3, wherein each of the one or more first and second sub-transconductors is a differential input/output transconductor.

5. A transconductor according to claim 4, wherein the differential input/output transconductor has an input terminal with a first polarity, an input terminal with a second polarity, an output terminal with a first polarity, and an output terminal with a second polarity; a difference between a first input voltage which is input to the input terminal with a first polarity and a second input voltage which is input to the input terminal with a second polarity is equal to the input voltage; and a difference between a first output current which is output from the output terminal with a first polarity and a second output current which is output from the output terminal with a second polarity is equal to the output current.

6. A transconductor according to claim 5, further comprising:

a first transistor with a first polarity which has a source connected to a power supply with a first polarity, a gate connected to a bias terminal, and a drain connected to the output terminal with a first polarity;

a second transistor with a first polarity which has a source connected to the power supply with a first polarity, a gate connected to the bias terminal, and a drain connected to the output terminal with a second polarity;

first and second sub-transconductor components each having at least one unit transconductor, the first and second sub-transconductor components being connected to the output terminal with a first polarity; and third and fourth sub-transconductor components each having at least one unit transconductor, the third and fourth sub-transconductor components being connected to the output terminal with a second polarity, wherein the first and third sub-transconductor components are connected to the first input terminal to which the first input voltage is input, and the second and fourth sub-transconductor components are connected to the second input terminal to which the second input voltage is input, whereby a sub-transconductor formed by the first and fourth sub-transconductor components has a transconductance with a first polarity, and a sub-transconductor formed by the second and third sub-transconductor components has a transconductance with a second polarity, and by the at least one control signal which is input to the first and fourth sub-transconductor components and to the second and third sub-transconductor components, the transconductance with a first polarity of sub-transconductor formed by the first and fourth sub-transconductor components and the transconductance with a second polarity of sub-transconductor formed by the second and third sub-transconductor components are controlled.

7. A transconductor according to claim 6, wherein the control signal which is input to the first and fourth sub-transconductor components and the control signal which is input to the second and third sub-transconductor components are different.

8. A transconductor according to claim 6, wherein the unit transconductor includes:

a third transistor with a second polarity which has a gate to which one of the first and second input voltages is input and a source connected to a power supply with a second polarity; and a fourth transistor with a second polarity which has a gate to which the control signal is input, a source connected to a drain of the third transistor, and a drain connected to one of the output terminal with a first polarity and the output terminal with a second polarity.

9. A transconductor according to claim 8, wherein each of the first to fourth sub-transconductor components includes a pair of unit transconductors.

10. A transconductor according to claim 6, wherein the sub-transconductor component includes:

a third transistor with a second polarity which has a gate to which one of the first and second input voltages is input and a source connected to a power supply with a second polarity;

a fourth transistor with a second polarity which has a gate to which the control signal is input, a source connected to a drain of the third transistor, and a drain connected to one of the output terminal with a first polarity and the output terminal with a second polarity;

a fifth transistor with a second polarity which has a gate to which one of the first and second input voltages is input and a source connected to a power supply with a second polarity; and a sixth transistor with a second polarity which has a gate to which the control signal is input, a source connected to a drain of the fifth transistor, and a drain connected to the output terminal to which a drain of the fourth transistor is connected.

11. A transconductor according to claim 10, wherein the control signal which is input to the fourth transistor and the control signal which is input to the sixth transistor are different.

12. A filter circuit, comprising:

the transconductor of claim 1; and a capacitor connected to the transconductor.

13. A filter circuit according to claim 12, wherein a plurality of the filter circuits are connected into a ladder arrangement or a cascade arrangement.

* * * * *